United States Patent
Kawai et al.

(10) Patent No.: US 12,453,069 B2
(45) Date of Patent: Oct. 21, 2025

(54) WAREHOUSE SYSTEM

(71) Applicant: FUJI CORPORATION, Chiryu (JP)

(72) Inventors: Hidetoshi Kawai, Anjo (JP); Fumitaka Maeda, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 765 days.

(21) Appl. No.: 17/777,796

(22) PCT Filed: Nov. 25, 2019

(86) PCT No.: PCT/JP2019/045898
§ 371 (c)(1),
(2) Date: May 18, 2022

(87) PCT Pub. No.: WO2021/106026
PCT Pub. Date: Jun. 3, 2021

(65) Prior Publication Data
US 2022/0411185 A1      Dec. 29, 2022

(51) Int. Cl.
*H05K 13/02*      (2006.01)
*B25J 9/12*       (2006.01)
(Continued)

(52) U.S. Cl.
CPC ............ *H05K 13/086* (2018.08); *B25J 9/123* (2013.01); *B65G 1/0485* (2013.01);
(Continued)

(58) Field of Classification Search
CPC ............... B65G 1/0485; B65G 1/1371; B65G 2203/0216; H05K 13/021; H05K 13/086; H05K 13/0882; B25J 9/123
See application file for complete search history.

(56) References Cited

U.S. PATENT DOCUMENTS 5,822,210 A      10/1998   Kobayashi et al.
10,820,459 B2 *  10/2020   Kondo .................. H05K 13/08
(Continued)

FOREIGN PATENT DOCUMENTS

CN      114868466 A  *  8/2022   .......... H05K 13/086
JP      10-34459 A      2/1998
(Continued)

OTHER PUBLICATIONS

International Search Report issued Feb. 10, 2020 in PCT/JP2019/045898, filed on Nov. 25, 2019, citing documents AA-AB, AO & AQ-AT therein, 3 pages.

*Primary Examiner* — Thomas Randazzo
(74) *Attorney, Agent, or Firm* — Oblon, McClelland, Maier &Neustadt, L.L.P.

(57) ABSTRACT

A warehouse system includes a component container warehouse configured to store multiple component containers that accommodate multiple components, a component supply unit warehouse configured to store multiple component supply units used when supplying the components accommodated in the component container to a component mounter, a component container loader configured to load the component container into the component supply unit, and a conveyance robot configured to move between the component container warehouse, the component supply unit warehouse, and the component container loader to convey the component container and the component supply unit to the component container loader.

14 Claims, 4 Drawing Sheets

(51) Int. Cl.
 *B65G 1/04* (2006.01)
 *B65G 1/137* (2006.01)
 *H05K 13/04* (2006.01)
 *H05K 13/08* (2006.01)

(52) U.S. Cl.
 CPC ......... *B65G 1/1371* (2013.01); *H05K 13/021* (2013.01); *H05K 13/0882* (2018.08); *B65G 2203/0216* (2013.01)

(56) References Cited

U.S. PATENT DOCUMENTS

| | | | |
|---|---|---|---|
| 11,457,551 B2* | 9/2022 | Brown | H05K 13/0495 |
| 2014/0239735 A1 | 8/2014 | Abe et al. | |
| 2018/0242485 A1* | 8/2018 | Kondo | H05K 13/0473 |
| 2022/0347848 A1* | 11/2022 | Nakayama | B25J 9/1674 |

FOREIGN PATENT DOCUMENTS

| | | | | |
|---|---|---|---|---|
| JP | 2006-345588 A | 12/2006 | | |
| JP | WO-2012115117 A1 * | 8/2012 | ............. | H02J 50/12 |
| JP | 2013-59239 A | 3/2013 | | |
| JP | 2013-126908 A | 6/2013 | | |
| JP | 2017216379 A * | 12/2017 | ......... | H05K 13/0417 |
| JP | WO-2019142336 A1 * | 7/2019 | ............. | H05K 13/02 |
| WO | WO 2014/010083 A1 | 1/2014 | | |
| WO | WO 2019/058431 A1 | 3/2019 | | |
| WO | WO 2019/142336 A1 | 7/2019 | | |

\* cited by examiner

WAREHOUSE SYSTEM

TECHNICAL FIELD

The present specification relates to a warehouse system used for the support of a component mounter.

BACKGROUND ART

A technique of mass-producing board products by executing board work on a board on which printed wiring is applied has become widespread. Further, in general, multiple types of board work machines that execute board work are provided side by side to constitute a board work line. A component mounter among the board work machines uses a component supply unit loaded with a component container that accommodates multiple components. In many cases, the component container and the component supply unit are stored in a warehouse. Then, a preparation for use is completed by a loading work that loads the component container into the component supply unit. Technical examples related to storage and preparation for use of the component container and the component supply unit are disclosed in Patent Literatures 1 and 2.

Patent Literature 1 discloses a manufacturing management system that manufactures a printed circuit board (a board product) by controlling an SMT line (a board work line). The manufacturing management system includes a reel stocker, a cartridge stocker, and a control personal computer that manages both stockers. The control personal computer includes a database that stores various data files related to the manufacture of the printed circuit board, a setup support section that instructs a setup work, and a mounting data creating section that creates mounting data for mounting a component on the printed circuit board. With this, even for SMT lines having different facility specifications and configurations, it is regarded that the setup work can be efficiently performed, and the mounting data according to the setup information can be created.

In addition, a component mounting system disclosed in Patent Literature 2 includes a component storage container that stores multiple feeder instruments (one form of a component supply unit) accommodating multiple components, a replenishing device that replenishes a feeder instrument to the component mounter and collects a feeder instrument from the component mounter, and a conveyance means that conveys the replenishing device between the component storage container and multiple component mounters. With this, it is regarded that necessary components can be automatically and efficiently replenished, so that labor saving and automation are possible.

PATENT LITERATURE

Patent Literature 1: JP-A-H10-34459
Patent Literature 2: International Publication No. WO2014/010083

BRIEF SUMMARY

Technical Problem

Incidentally, Patent Literatures 1 and 2 realize a function of supplying by delivering a component container and a component supply unit stored in a warehouse (a stocker, a component storage container) according to an instruction. However, the loading work that loads the component container into the component supply unit is executed by an operator. In addition, although a device that automates the loading work is put into practical use, the carry-in to the devices of the component container and the component supply unit is executed by an operator. Therefore, it cannot be said that a sufficient labor saving has been achieved.

It is an object of the present specification to provide a warehouse system which is used for supporting a component mounter and achieves further labor saving than before in the loading work that loads a component container into a component supply unit.

Solution to Problem

The present specification discloses that a warehouse system which includes a component container warehouse configured to store multiple component containers that accommodate multiple components, a component supply unit warehouse configured to store multiple component supply units used when supplying the components accommodated in the component container to a component mounter, a component container loader configured to load the component container into the component supply unit, and a conveyance robot configured to move between the component container warehouse, the component supply unit warehouse, and the component container loader to convey the component container and the component supply unit to the component container loader.

Advantageous Effects

In the warehouse system disclosed in the present specification, the conveyance robot conveys the component container stored in the component container warehouse to the component container loader, and conveys the component supply unit stored in the component supply unit warehouse to the component container loader. In addition, the component container loader loads the component container into the component supply unit. As a result, the preparation for using the component supply unit in the component mounter is automatically completed. Therefore, an operator is not involved in the loading work, so that further labor saving is achieved than before.

DESCRIPTION OF EMBODIMENTS

1. Configuration of Warehouse System 1 according to First Embodiment

A configuration of warehouse system 1 according to a first embodiment will be described with reference to FIG. 1. Warehouse system 1 is used for supporting one or multiple component mounters 91 that constitutes board work line 9. In addition, multiple component mounters 91 of board work line 9 can be regarded as support targets in warehouse system 1. Component mounter 91 executes a mounting work that mounts a component on a board using a component supply unit in which a component container is loaded. Warehouse system 1 is in charge of work which relates to store and support the component container and the component supply unit.

The component container accommodates multiple components. The component supply unit is used when supplying a component accommodated in the component container to component mounter 91. The component supply unit does not need to be an integral type, and may be configured as a separate type. In the present specification, a combination of at least a part of the component container and the component supply unit, or any one of them is referred to as "instrumentation".

Figure 1:
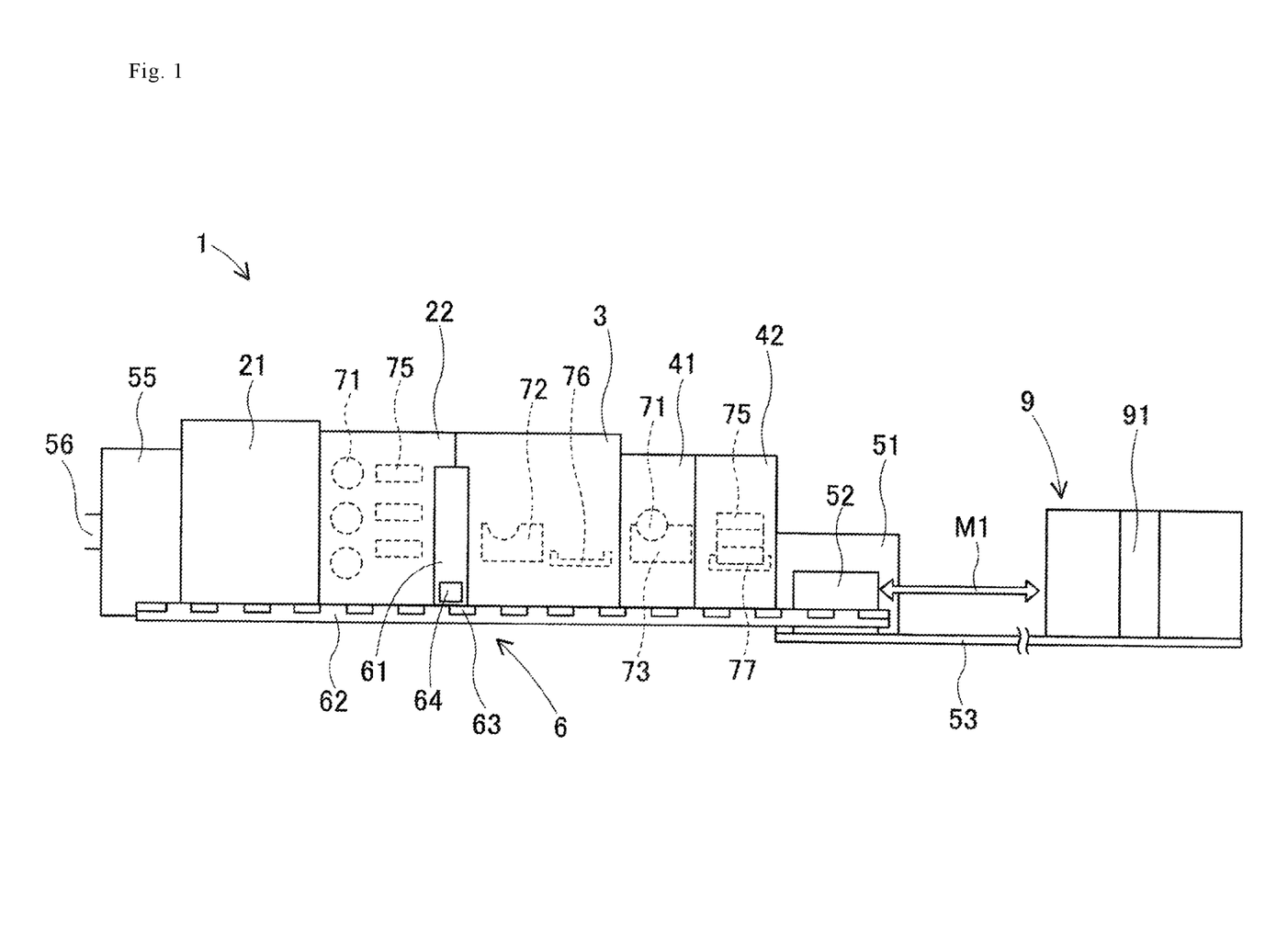
FIG. 1 is a front view schematically illustrating a warehouse system according to a first embodiment.

Tape reel 71 can be exemplified as a component container and a feeder device can be exemplified as a component supply unit (indicated by dashed lines in FIG. 1). A carrier tape in which multiple components are sealed at a predetermined pitch is wound and held on tape reel 71. The feeder device supplies components to the component mounting tool of component mounter 91 by pulling out the carrier tape from tape reel 71 and sending the carrier tape to the component unloading position. There are roughly two types of feeder devices, one of the integral type and the other of the separate type.

Integral type feeder device 72 (indicated by dashed lines in FIG. 1) is equipped on component mounter 91 in the form of prepared feeder device 73 loaded with tape reel 71. When the components of tape reel 71 are completely consumed, the entire prepared feeder device 73 is exchanged. There may be a case that only tape reel 71 is exchanged. On the other hand, the separate type feeder device includes a feeder main body that has a built-in feeding mechanism of a carrier tape, and a reel cassette in which tape reel 71 is loaded. The feeder main body is permanently installed in component mounter 91, and a separate reel cassette is disposed in the vicinity of the feeder main body. When the components of tape reel 71 are completely consumed, the reel cassette is exchanged.

Figure 3:
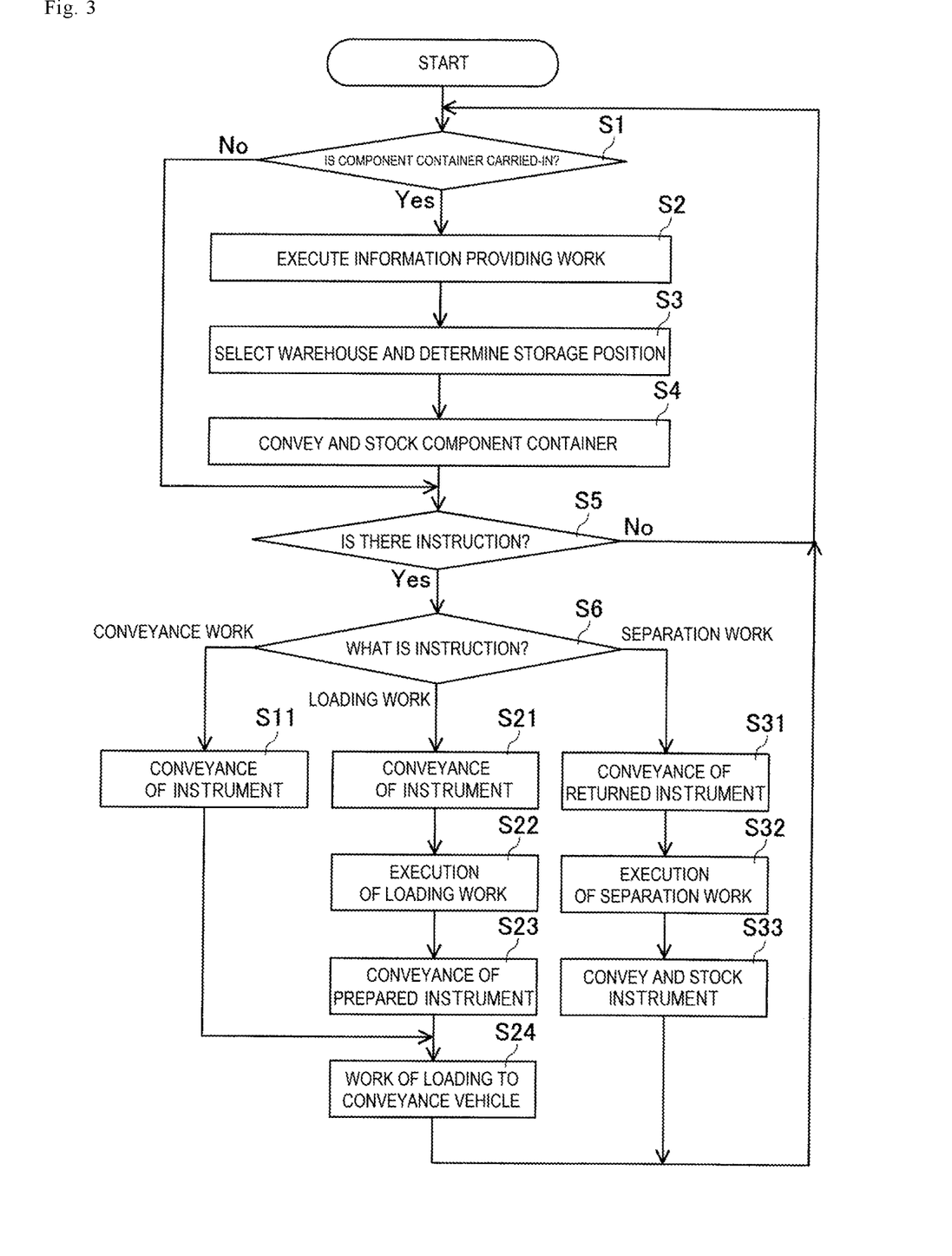
FIG. 3 is a diagram illustrating an operation flow which describes an operation of the warehouse system according to the first embodiment.

As described below, prepared feeder device 73 is prepared by warehouse system 1. Similarly, a prepared reel cassette loaded with tape reel 71 is prepared by warehouse system 1. In FIG. 3, a case where integral type feeder device 72 is used is illustrated, and an illustration of a separate type feeder device is omitted.

In addition, tray 75 can be exemplified as a component container, and tray loading unit 76 can be exemplified as a component supply unit (indicated by dashed lines in FIG. 1). Tray 75 has multiple component accommodation sections that accommodate components respectively. Generally, multiple component accommodation sections are arranged in a two-dimensional lattice. Tray loading unit 76 is equipped on component mounter 91 in the form of prepared tray loading unit 77 in which tray 75 is loaded. When the components of tray 75 are completely consumed, the entire prepared tray loading unit 77 is exchanged. There may be a case that only tray 75 is exchanged. As described below, prepared tray loading unit 77 is prepared by warehouse system 1. In addition, tray loading unit 76 is stacked and loaded by multiple trays 75, and may have a mechanism in which trays 75 whose components have been consumed are removed in order from the top.

Warehouse system 1 according to the first embodiment is configured of multiple warehouse modules and conveyance robot 6. As illustrated in FIG. 1, seven warehouse modules are provided in parallel. That is, in order from the left side to the right side, a carry-in and information providing section 55, first component container warehouse 21, second component container warehouse 22, component supply unit warehouse 3, reel loader 41, tray loader 42, and conveyance vehicle stopping section 51 are provided side by side.

Each of the warehouse modules has a delivery port (not illustrated) on the front side for delivering conveyance robot 6 and the instrumentation. The arrangement and shape of the delivery port in each of the warehouse modules are commonized. In FIG. 1, each of the warehouse modules is illustrated as a rectangular parallelepiped having a different size, but the actual shape may differ from the rectangular parallelepiped. In addition, an arrangement in which multiple warehouse modules are not arranged in line and an arrangement in which multiple warehouse modules are separated from each other are allowed.

Conveyance robot 6 includes robot main body 61 and moving path 62. Moving path 62 is laid so as to pass through the front side of all the warehouse modules. Robot main body 61 has a moving mechanism such as a linear motor and a traveling wheel, and moves along moving path 62. Therefore, robot main body 61 moves between each of the warehouse modules, and the movement range thereof extends from the carry-in and information providing section 55 at the left end to conveyance vehicle stopping section 51 at the right end.

Multiple robot main bodies 61 may be provided. In addition, moving path 62 may be double-lined or circularized, or may have a more complicated movement path. Multiple robot main bodies 61 are controlled by warehouse control section 82 (refer to FIG. 2), which will be described below, to move while avoiding collisions.

Non-contact power transmitting sections 63 are provided near the upper surface of moving path 62 at regular intervals. On the other hand, non-contact power receiving section 64 is provided at a lower part of robot main body 61. Robot main body 61 is supplied with power by a configuration of the non-contact power supply section consisting of non-contact power transmitting section 63 and non-contact power receiving section 64. As a non-contact power supply section, a configuration of an electromagnetic coupling type using a coil can be exemplified, and the present disclosure is not limited to this.

Robot main body 61 has an arm (not illustrated) that grips the instrumentation, and performs a delivery operation of the instrumentation at the delivery port of the warehouse module. In more detail, at the front side of a certain warehouse module, robot main body 61 grips the instrumentation placed on the delivery port by using the arm. Next, robot main body 61 conveys the instrumentation by moving to another target warehouse module. Finally, at the front side of another warehouse module, robot main body 61 releases the arm and places the instrumentation on the delivery port. Each of the warehouse modules may have an arm, and robot main body 61 may only include a conveyance function that conveys the instrumentation.

Carry-in and information providing section 55 is a form of a work execution section that executes a predetermined work on the component container. In addition, carry-in and information providing section 55 also serves as a carry-in section into which the component container is carried. Carry-in and information providing section 55 has carry-in port 56 of the component container on the left surface. Carry-in and information providing section 55 moves the component container carried into carry-in port 56 to a work execution section therein (not illustrated). The work execution section executes an information providing work that provides individual identification information to the component container.

The individual identification information is provided to each of the component containers such as tape reel 71 and tray 75 described above. Examples of the work contents of the information providing work may include printing of an individual identification number and attaching of an individual identification barcode. Carry-in and information providing section 55 places the component container to winch the individual identification information is provided on the delivery port, so that the component container is in a conveyable state. As a result, the information providing work and the conveyed-out to the component container are automatically executed, so that labor saving is achieved.

First component container warehouse 21 is a warehouse with a desiccator, and stores multiple component containers. First component container warehouse 21 preferentially stocks, stores, and delivers component containers of components that are averse to moisture. Examples of the moisture-averse components include an IC component and an LSI component, which are stored in the form of tape reel 71 and tray 75, respectively. First component container warehouse 21 may store other non-priority components, feeder device 72, and tray loading unit 76 in a case where there is enough storage space.

Second component container warehouse 22 is a general-purpose warehouse, and there are no particular constraints on multiple component containers which are stored. Second component container warehouse 22 stocks, stores, and delivers component containers such as tape reel 71 and tray 75. These component containers are conveyed from carry-in and information providing section 55 by conveyance robot 6.

Component supply unit warehouse 3 stocks, stores, and delivers multiple component supply units such as integral type feeder device 72, a reel cassette, and tray loading unit 76. These component supply units are carried into the delivery port of component supply unit warehouse 3 by an operator. Alternatively, these component supply units are conveyed by conveyance robot 6.

The internal configurations of first component container warehouse 21, second component container warehouse 22, and component supply unit warehouse 3 are similar to each other. For example, these warehouses include storage shelves and in-warehouse conveyance sections. The storage shelf has multiple storage positions two-dimensionally arranged in the width direction and the height direction, and stores the instrumentation at each storage position. The in-warehouse conveyance section conveys the instrumentation between the storage position and the delivery port. Not limited to this, in these warehouses, for example, multiple storage shelves may be provided in a front-rear direction.

Each of reel loader 41 and tray loader 42 is a form of a component container loader that loads a component container into a component supply unit. Reel loader 41 executes a loading work that loads tape reel 71 into feeder device 72 or the reel cassette. Specifically, reel loader 41 moves tape reel 71, and feeder device 72 or the reel cassette which are placed on the delivery port by conveyance robot 6 to the work execution section therein (not illustrated). The work execution section loads tape reel 71 in a predetermined posture at a predetermined position of feeder device 72 or the reel cassette. As a result, the loading work of tape reel 71 is completed, and tape reel 71 is prepared to be used in component mounter 91. Prepared feeder device 73 that the preparation to be used is completed or the prepared reel cassette is placed on the delivery port or temporarily stored therein.

Reel loader 41 may have a function of a separation work that removes tape reel 71 from prepared feeder device 73 or the prepared reel cassette. Tape reel 71 which is separated is returned to second component container warehouse 22 and stored. In addition, feeder device 72 or the reel cassette from which tape reel 71 is removed is returned to component supply unit warehouse 3 and stored.

Tray loader 42 executes the loading work that loads tray 75 into tray loading unit 76. Specifically, tray loader 42 moves a predetermined number of trays 75 and tray loading unit 76 placed on the delivery port by conveyance robot 6 to the work execution section therein (not illustrated). The work execution section loads tray 75 at a predetermined position of tray loading unit 76 in a predetermined posture. As a result, the loading work of tray 75 is completed, and tray 75 is prepared to be used in component mounter 91. Prepared tray loading unit 77 that the preparation to be used is completed (tray loading unit 76 loaded with tray 75) is placed on the delivery port or temporarily stored therein.

Tray loader 42 may have a function of a separation work that removes tray 75 from prepared tray loading unit 77. Tray 75 which is separated is returned to second component container warehouse 22 and stored. In addition, tray loading unit 76 from which tray 75 is removed is returned to component supply unit warehouse 3 and stored.

Here, a stand-alone type information providing device, a reel loading device, and a tray loading device have been conventionally used. However, in the stand-alone type, it is necessary for an operator to carry in and out the instrumentation. In the first embodiment, since the provision of conveyance robot 6 reduces a carry in and out work by an operator, further labor saving is achieved than before.

Conveyance vehicle stopping section 51 stops conveyance vehicle 52 which is movable between warehouse system 1 and component mounter 91. Conveyance vehicle stopping section 51 executes the work of loading the instrumentation received from conveyance robot 6 onto conveyance vehicle 52. As indicated by arrow M1 in FIG. 1, conveyance vehicle 52 travels through conveyance path 53 that connects warehouse system 1 and board work line 9, and conveys the loaded instrumentation to component mounter 91. Therefore, conveyance vehicle stopping section 51 serves as a carry-out section from which at least one of the component container and the component supply unit is carried out.

In addition, conveyance vehicle 52 conveys idle instrumentation that has been used in component mounter 91 and has no use plan for the time being from component mounter 91 to conveyance vehicle stopping section 51 in a reverse direction. The instrumentation conveyed in the reverse direction is returned to any warehouse or any loader by conveyance robot 6. Accordingly, conveyance vehicle stopping section 51 serves as a carry-in section into which at least one of the component container and the component supply unit is carried.

Multiple conveyance vehicles 52 may be provided. Further, in a configuration in which multiple board work lines 9 are regarded as support targets, conveyance path 53 may be branched or circularized in the middle thereof, and a more complicated conveyance path may be constituted. Multiple conveyance vehicles 52 are controlled by conveyance control section 83 (refer to FIG. 2) described below, and travel while avoiding collision.

2. Common Element of Warehouse Module

Here, seven warehouse modules have a common element that is common to each other. As a result, changing in increase and decrease and changing in arrangement of the warehouse modules can be easily performed. In general, the term "module" means a constituent unit that has a common element and is easy to change. The common element includes at least one of the following six items.

1) Commonization of at least one of an external shape and an installation structure,
2) Commonization of at least one of a power supply specification and a power supply section,
3) Commonization of at least one of a communication specification and a communication section,
4) Commonization of a control section that controls an operation of a warehouse module,
5) Commonization of an upper-level control section that issues a command to a warehouse module, and
6) Commonization of a carry-in and carry-out process of instrumentation into and from the warehouse module, Hereinafter, descriptions will be given in order.

1) In a first embodiment, although external shapes of warehouse modules except conveyance vehicle stopping section 51 are different from each other, the installation structure is commonized. For example, fixing seats are provided at a constant pitch on a common base or a floor. On the other hand, on a bottom face of each of the warehouse modules, installation seats having a common shape are provided at the same constant pitch. The installation seat of the warehouse module is fixed to the fixing seat using the same fixture, for example, bolts of the same thickness and length.

With this, multiple types of warehouse modules are installed on the same common base or floor by the same method even if the total number of installation seats is different. Therefore, installation work of the warehouse module is simple. In addition, the expansion work for additionally installing the warehouse module and the relocation work for changing the arrangement order and the position of the warehouse module are as simple as the installation work.

2) Power supply specifications of multiple types of warehouse modules are commonized. For example, the power supply specifications in which alternating current and direct current are used in combination with the power supply, or voltage levels are different between the drive power supply and the control power supply are commonized. With this, power can be supplied from a common power supply section to multiple warehouse modules using a power cable. Therefore, it is no longer needed to provide a power supply section in each of the warehouse modules, and the simplification of the structure and the reduction of the cost can be realized.

3) Communication specifications of multiple types of warehouse modules and a configuration of communication section are commonized. With this, since the same communication section can be commonly applied to multiple warehouse modules, the hardware cost is reduced. In addition, since the communication software is also commonized, the development cost of the software is reduced.

It is assumed that the communication specifications are not unified due to a difference in the makers of multiple types of warehouse modules or due to the old and new manufacturing time. In this case, a separate interface device is required in order to realize communications between the warehouse module and warehouse control section 82 (described below) and communications between the warehouse modules. As a result, there arise such harmful effects as an increase in the cost and a decrease in the communication reliability.

4) A control section that controls an operation of a warehouse module is commonized. For example, algorithms for determining storage positions in three warehouses and logic for controlling the in-warehouse conveyance sections are commonized. As a result, three warehouses are efficiently used. In addition, for example, handling conditions for handling the instrumentation at the delivery port of each warehouse module are commonized. With this, the delivery operation is commonized regardless of the difference in the individual functions of the warehouse modules. Therefore, an equivalent operation reliability which relates to the delivery of the instrumentation can be obtained in each warehouse module, and the development cost of the software is reduced.

5) Warehouse control section 82 is commonly provided as an upper-level control section that issues a command to a warehouse module. With this, the delivery of the instrumentation between the warehouse modules is unitarily managed. Therefore, the delivery operation of the instrumentation and the work in the work execution section are executed in a timely and efficient manner.

6) A carry-in and carry-out process of instrumentation into and from each warehouse module, that is, an arrangement and a shape of a delivery port are commonized. With this, the delivery operation of the instrumentation by conveyance robot 6 is simplified and smoothed, so that the operation reliability is improved.

3. Functional Configurations of Warehouse System 1 and Production Management System 8

Figure 2:
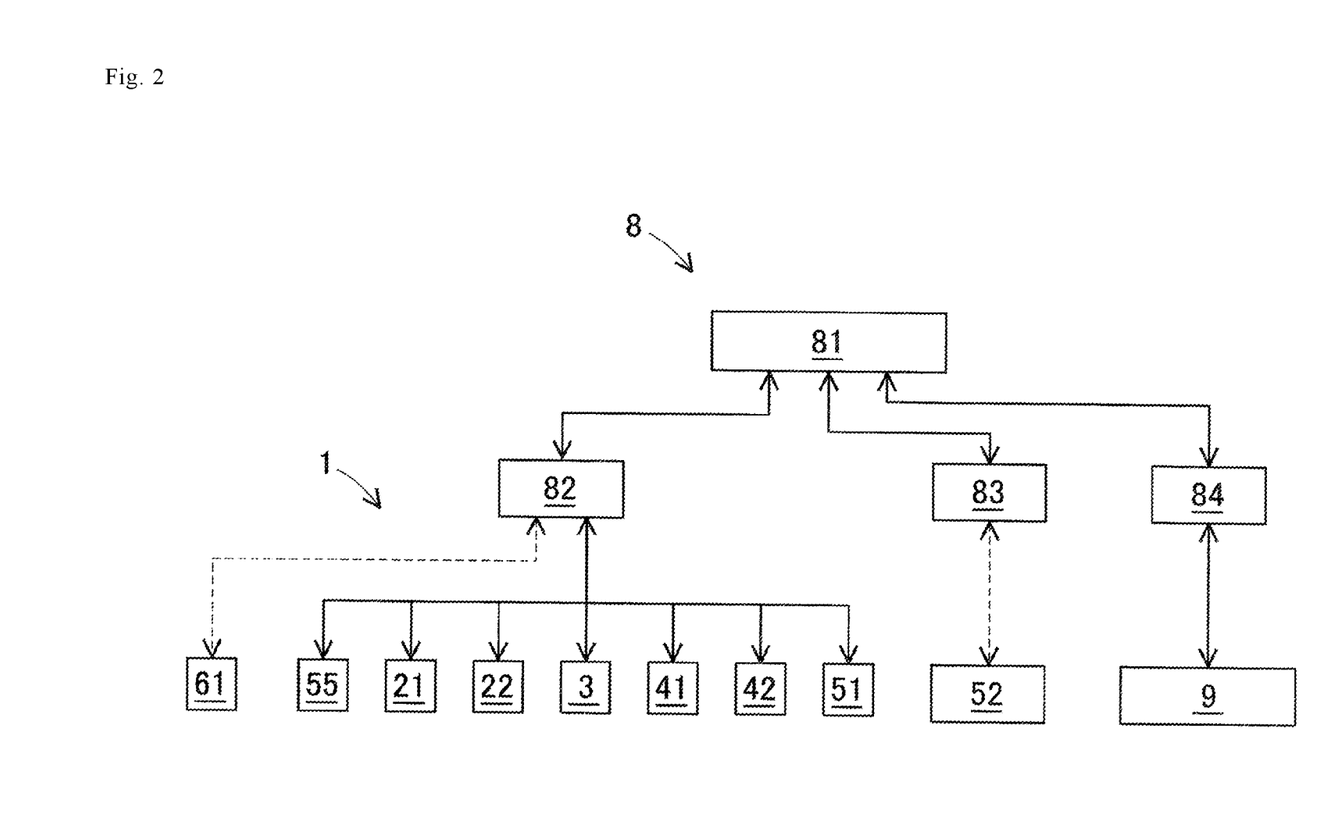
FIG. 2 is a control block diagram of the warehouse system and an upper-level production management system according to the first embodiment.

Next, the functional configuration of warehouse system 1 and the functional configuration of the upper-level production management system 8 according to the first embodiment will be described with reference to FIG. 2. As illustrated in FIG. 2, production management system 8 includes production management section 81, warehouse control section 82, conveyance control section 83, and line control section 84. Production management section 81 is positioned in an upper-level of the control. Warehouse control section 82, conveyance control section 83, and line control section 84 are wired and communicatively connected to production management section 81 and are positioned in the lower-level of production management section 81.

Production management section 81 promotes a production plan of board product to be produced on board work line 9, and manages the progress status of production. Specifically, production management section 81 issues an instruction to prepare necessary instrumentation to warehouse control section 82 when starting the production of the board product or switching the type of the board product being produced. In addition, production management section 81 issues an instruction to conveyance control section 83 to convey the prepared instrumentation from warehouse system 1 to board work line 9.

When necessary instrumentation is conveyed to and mounted on component mounter 91 of board work line 9, production management section 81 issues an instruction to start the production of the board product to line control section 84. As a result, board work line 9 executes the board work to advance the production of the board product. The information of the production record of the board product is appropriately notified from line control section 84 to production management section 81. In addition, when components are consumed and reduced by the progress of production, the information of the reduced components is notified from line control section 14 to production management section 81. Production management section 81 issues an instruction for replenishing the components to warehouse control section 82 and conveyance control section 83.

Warehouse system 1 includes warehouse control section 82. Warehouse control section 82 is wired and communicatively connected to each of the warehouse modules. In addition, warehouse control section 82 is wirelessly communicatively connected to robot main body 61 (indicated by dashed lines). Warehouse control section 82 issues a command to each warehouse module and robot main body 61 based on the instruction received from production management section 81. On the other hand, warehouse control section 82 acquires information which relates to the operation status from each warehouse module and robot main body 61.

However, warehouse control section 82 advances the control of the carry-in of the component container without receiving the instruction of production management section 81. That is, warehouse control section 82 commands the execution of the information providing work when the component container is carried into carry-in port 56. In addition, warehouse control section 82 selects a warehouse to be stored based on the type and quantity of the carried-in component container, and determines a storage position. Thereafter, warehouse control section 82 commands robot main body 61 to convey the component container, and commands the selected warehouse to stock and store the component container. In addition, warehouse control section 82 notifies production management section 81 of the stored information related to the component container.

In the control other than the carry-in of the component container, warehouse control section 82 commands first component container warehouse 21, second component container warehouse 22, and component supply unit warehouse 3 to stock, store, and deliver the instrumentation. In addition, warehouse control section 82 commands reel loader 41 and tray loader 42 to execute the loading work. In addition, warehouse control section 82 commands conveyance vehicle stopping section 51 to load and unload the instrumentation onto conveyance vehicle 52. Each of the warehouse modules executes a commanded operation or work, and notifies warehouse control section 82 of the progress status.

In a case where the instruction from production management section 81 is a loading work, warehouse control section 82 first commands robot main body 61 to convey the component container and the component supply unit stored in any of warehouses. Next, warehouse control section 82 commands reel loader 41 or tray loader 42 to execute the loading work. Next, warehouse control section 82 commands robot main body 61 to convey the prepared instrumentation to conveyance vehicle stopping section 51.

In a case where the instruction is a conveyance work of the instrumentation to component mounter 91, warehouse control section 82 commands robot main body 61 to convey the instrumentation stored in any of the warehouses to conveyance vehicle stopping section 51. In both the loading work and the conveyance work, warehouse control section 82 commands conveyance vehicle stopping section 51 to load the instrumentation onto conveyance vehicle 52.

Conveyance control section 83 is wirelessly communicatively connected to conveyance vehicle 52 (indicated by dashed lines). Conveyance control section 83 controls the conveyance of the instrumentation by conveyance vehicle 52. Conveyance control section 83 receives an instruction from production management section 81, and causes conveyance vehicle stopping section 51 to stop conveyance vehicle 52. When the instrumentation is loaded on conveyance vehicle 52, conveyance control section 83 causes conveyance vehicle 52 to travel from warehouse system 1 to component mounter 91. The instrumentation conveyed by conveyance vehicle 52 is mounted on component mounter 91 and used. A mounting work and a removal work of the instrumentation on and from component mounter 91 are automatically or manually performed.

Line control section 84 is wired and communicatively connected to each of board work machines constituting board work line 9. Line control section 84 controls an operation of each of the board work machines, Line control section 84 receives an instruction from production management section 81, and causes the board work machine to execute the board work. Line control section 84 notifies production management section 81 of the information of the production record of the board product and the information of the reduced components.

When the production of a certain type of board product is completed, idle instrumentation which is not used in the next production plan becomes apparent. Production management section 81 issues an instruction to return the idle instrumentation to warehouse system 1 to conveyance control section 83 and warehouse control section 82. At this time, conveyance control section 83 controls the conveyance in the reverse direction from component mounter 91 to warehouse system 1. In addition, warehouse control section 82 controls a stock operation in the reverse direction from conveyance vehicle stopping section 51 to the warehouse or the loader.

4. Operation of Warehouse System 1 of First Embodiment

Next, the operation of warehouse system 1 according to the first embodiment will be described with reference to an operation flow illustrated in FIG. 3. This operation flow is mainly performed under the control of warehouse control section 82. In step S1 in FIG. 3, warehouse control section 82 investigates whether the component container is carried into carry-in port 56. In step S2 which is a case where the component container is carried into carry-in port 56, carry-in and information providing section 55 executes an information providing work.

In the next step S3, warehouse control section 82 selects a warehouse that stores the component container to which the individual identification information is provided, and further determines a storage position. In the next step S4, conveyance robot 6 conveys the component container to the selected warehouse. The selected warehouse receives the component container and stocks the component container in the determined storage position. After step S4, and in a case where the component container is not carried into carry-in port 56 in step S1, the execution of the operation flow advances to step S5.

In step S5, warehouse control section 82 confirms whether an instruction is received from production management section 81. In step S6 which is a case where the instruction is received from production management section 81, warehouse control section 82 investigates the content of the instruction and determines the branch destination of the operation flow. That is, warehouse control section 82 designates step S11 when the instruction is a conveyance work, step S21 when the instruction is a loading work, and step S31 when the instruction is a separation work, as branch destinations, respectively.

In step S11 which is a case where the content of the instruction is a conveyance work, warehouse control section 82 commands the warehouse module that stores the instrumentation to be conveyed to deliver the instrumentation. The warehouse module that has received the command delivers the instrumentation to the delivery port. Next, warehouse control section 82 gives a conveyance command to robot main body 61. Conveyance robot 6 receives the instrumentation from the delivery port of the warehouse module, and conveys the instrumentation to conveyance vehicle stopping section 51.

Step S11 is executed when the remaining number of components is reduced and an exchange work of tape reel 71 or tray 75 is performed in component mounter 91. In addition, step S11 is executed on prepared feeder device 73 or prepared reel cassette which is temporarily stored in reel loader 41. Further, step S11 is executed on prepared tray loading unit 77 which is temporarily stored in tray loader 42. After step S11, the execution of the operation flow is merged with step S24 (described later).

In step S21 which is a case where the content of the instruction in step S6 is a loading work, warehouse control section 82 commands robot main body 61 to convey the component container and the component supply unit, which are to be targets of the instructed loading work. Hereinafter, a case where tape reel 71 and tray 75 are stored in second component container warehouse 22 will be described. In a case where tape reel 71 and tray 75 are stored in first component container warehouse 21, second component container warehouse 22 in the following description is replaced by first component container warehouse 21.

When tape reel 71 is loaded into feeder device 72 or the reel cassette, warehouse control section 82 first commands second component container warehouse 22 to deliver tape reel 71, and then gives a conveyance command to robot main body 61. Second component container warehouse 22 delivers tape reel 71 to the delivery port in accordance with the command. Robot main body 61 receives tape reel 71 from second component container warehouse 22, and conveys tape reel 71 to reel loader 41.

Next, warehouse control section 82 commands component supply unit warehouse 3 to deliver feeder device 72 or the reel cassette, and then gives a conveyance command to robot main body 61. Component supply unit warehouse 3 delivers feeder device 72 or the reel cassette to the delivery port in accordance with the command. Robot main body 61 receives feeder device 72 or the reel cassette from component supply unit warehouse 3, and conveys feeder device 72 or the reel cassette to reel loader 41. Robot main body 61 may convey tape reel 71, and feeder device 72 or the reel cassette together.

In the next step S22, reel loader 41 executes the work of loading tape reel 71 into feeder device 72 or the reel cassette. Subsequently, reel loader 41 places prepared feeder device 73 or the prepared reel cassette on the delivery port. In addition, reel loader 41 notifies warehouse control section 82 that the loading work is completed. In the next step S23, warehouse control section 82 that has received the notification gives a conveyance command to robot main body 61. Robot main body 61 receives prepared feeder device 73 or the prepared reel cassette from reel loader 41, and conveys prepared feeder device 73 or the prepared reel cassette to conveyance vehicle stopping section 51.

In the next step S24, warehouse control section 82 commands conveyance vehicle stopping section 51 to load prepared feeder device 73 or the prepared reel cassette into conveyance vehicle 52. The subsequent conveyance to component mounter 91 is executed under the control of conveyance control section 83. After step S24, the execution of the operation flow is returned to step S1. In addition, when tray 75 is loaded in tray loading unit 76, the same operations as in steps S21 to S24 described above are executed except that tray loader 42 executes the loading work.

In step S31, which is a case where the content of the instruction in step S6 is a separation work, warehouse control section 82 commands robot main body 61 to return the instrumentation returned from component mounter 91 to reel loader 41 or tray loader 42. For example, in the case of the separation work that removes tape reel 71 from prepared feeder device 73 or the prepared reel cassette, warehouse control section 82 first commands conveyance vehicle stopping section 51 to unload prepared feeder device 73 or the prepared reel cassette from conveyance vehicle 52, and then gives a conveyance command to robot main body 61. Conveyance vehicle stopping section 51 unloads prepared feeder device 73 or the prepared reel cassette according to the command and places prepared feeder device 73 or the prepared reel cassette on the delivery port. Robot main body 61 receives prepared feeder device 73 or the prepared reel cassette from conveyance vehicle stopping section 51, and conveys prepared feeder device 73 or the prepared reel cassette to reel loader 41.

In the next step S32, revel loader 41 executes the separation work that removes tape reel 71 from prepared feeder device 73 or the prepared reel cassette. Subsequently, red loader 41 places tape reel 71, and feeder device 72 or the red cassette that have been separated on the delivery port. In addition, reel loader 41 notifies warehouse control section 82 that the separation work is completed.

In the next step S33, warehouse control section 82 that has received the notification gives a conveyance command to robot main body 61. Robot main body 61 receives tape reel 71, and feeder device 72 or the reel cassette, from reel loader 41. Next, robot main body 61 returns tape reel 71 to second component container warehouse 22, and returns feeder device 72 or the reel cassette to component supply unit warehouse 3. After step S33, the execution of the operation flow is returned to step S1. In the case of the separation work that removes tray 75 from prepared tray loading unit 77, the same operations as in steps S31 to S33 are executed except that tray loader 42 executes the separation work.

The separation work described above is not essential. In other words, prepared feeder device 73 or the prepared reel cassette returned from component mounter 91 may be stored in reel loader 41 or component supply unit warehouse 3 in a usable state. With this storage method, in a combination of tape reel 71 and feeder device 72 or the reel cassette that are intermittently used with the pause period interposed therebetween, it is possible to reduce the removal work and the reloading work of tape reel 71. Similarly, prepared tray loading unit 77 returned from component mounter 91 may be stored in tray loader 42 or component supply unit warehouse 3 in a usable state.

In addition, there may be a case of multiple instructions from production management section 81. For example, when the loading work to three feeder devices 72 or the reel cassettes is instructed, warehouse control section 82 repeatedly executes steps S21 to S24 three times. As a result, conveyance vehicle 52 can convey three prepared feeder devices 73 or three prepared reel cassettes together.

Further, in some cases, conveyance vehicle returns the idle instrumentation from component mounter 91 to conveyance vehicle stopping section 51, and then conveys prepared instrumentation to component mounter 91. In this case, warehouse control section 82 executes steps S21 to S24 corresponding to the instrumentation to be prepared in advance, and executes steps S31 to S33 corresponding to the returned instrumentation later. With this, since the work of unloading of the returned instrumentation and the work of loading of the prepared instrumentation are continuously performed without delay after conveyance vehicle 52 stops on conveyance vehicle stopping section 51, it is efficient.

In warehouse system 1 of the first embodiment, conveyance robot 6 conveys the component container (tape reel 71 and tray 75) stored in second component container warehouse 22 to the component container loader (reel loader 41 and tray loader 42), and conveys the component supply unit (feeder device 72, reel cassette, and tray loading unit 76) stored in component supply unit warehouse 3 to the component container loader. In addition, the component container loader loads the component container into the component supply unit. As a result, the preparation for using the component supply unit in the component mounter 91 is automatically completed. Therefore, an operator is not involved in the loading work, so that further labor saving is achieved than before.

In addition, since the seven warehouse modules have a common element, it is easy to additionally install the warehouse modules. Therefore, it is easy to respond to an increase in the storage amount of the instrumentation, and the cost required to respond is also low. In addition, since warehouse system 1 can be configured by freely combining multiple types of warehouse modules, it is possible to add a work execution function such as an information providing work in addition to the storage function, so that further labor saving is achieved than before.

5. Warehouse System 1A of Second Embodiment

Figure 4:
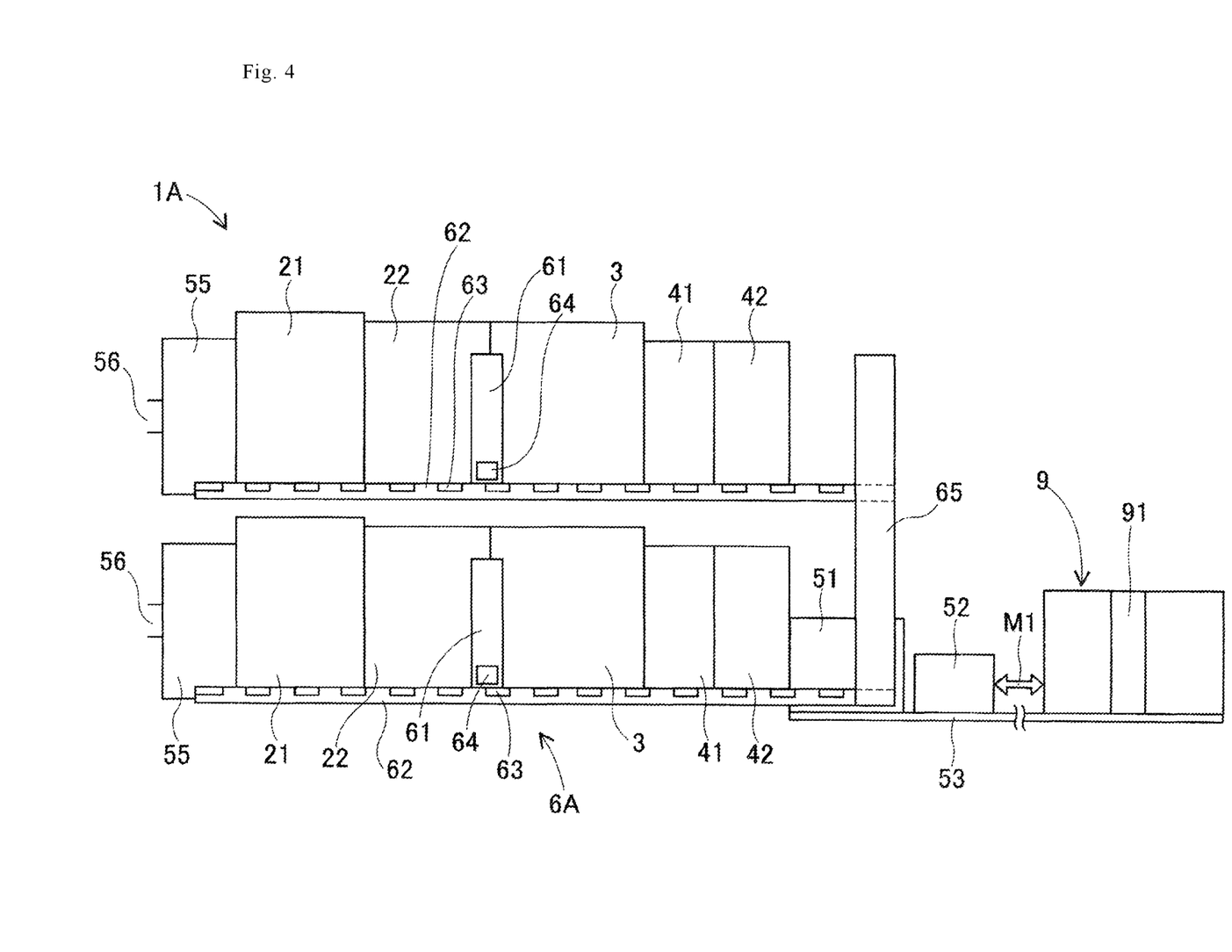
FIG. 4 is a front view schematically illustrating a warehouse system according to a second embodiment.

Warehouse system 1A according to the second embodiment will be described with reference to FIG. 4. As illustrated in FIG. 4, in warehouse system 1A according to the second embodiment, multiple warehouse modules are divided into a lower stage and an upper stage in a height direction and arranged. The type and arrangement of the warehouse module in the lower stage coincide with those of the first embodiment. The type and the arrangement of the warehouse module in the upper stage are such that conveyance vehicle stopping section 51 is omitted from the configuration of the lower stage.

Conveyance robot 6A includes two sets of robot main body 61 and moving path 62, each of which is in charge of a lower stage and an upper stage, and elevator 65. Robot main body 61 in charge of the upper stage moves to moving path 62 in the lower stage using elevator 65, and can move to conveyance vehicle stopping section 51 provided only in the lower stage. Two robot main bodies 61 are controlled by warehouse control section 82 to move while avoiding collisions.

In the second embodiment, the structure and function of each warehouse module, the operation of conveyance robot 6A, and the like are the same as those of the first embodiment. In warehouse system 1A of the second embodiment, since the warehouse modules are arranged in the upper and lower two stages, the storage amount of the instrumentation can be increased by about twice without increasing the installation space as compared with that of the first embodiment. In addition, the warehouse module can be arranged in three or more stages, so that multiple instrumentations are stored with higher space efficiency.

6. Applications and Modifications of Embodiments

Conveyance vehicle stopping section 51, conveyance vehicle 52, and conveyance path 53 may be omitted, and an operator may convey the prepared instrumentation to component mounter 91. In addition, the separation work executed by reel loader 41 may be executed by a separate reel unloader. Similarly, the separation work executed by tray loader 42 may be executed by a separate tray unloader.

In addition, first component container warehouse 21, second component container warehouse 22, and component supply unit warehouse 3 may store raw materials of board, incomplete board products in which some components are not mounted, board products determined to be defective by the board inspection machine and required to be repaired, and the like. In addition, warehouse system (1, 1A) may store solder used in the solder printing device, and instruments such as a screen and a squeegee, and may be conveyable from conveyance vehicle stopping section 51 to the solder printing device. In addition, the first and second embodiments are capable of various applications and modification.

REFERENCE SIGNS LIST

1,1A: Warehouse system, 21: First component container warehouse, 22: Second component container warehouse, 3: Component supply unit warehouse, 41: Reel loader, 42: Tray loader, 51: Conveyance vehicle stopping section, 52: Conveyance vehicle, 53: Conveyance path, 55: Carry-in and information providing section, 56: Carry-in port, 6: Conveyance robot, 61: Robot main body, 62: Moving path, 63: Non-contact power transmitting section, 64: Non-contact power receiving section, 65: Elevator, 71: Tape reel, 72: Feeder device, 73: Prepared feeder device, 75: Tray, 76: Tray loading unit, 77: Prepared tray loading unit, 8: Production management system, 81: Production management section, 82: warehouse control section, 83: Conveyance control section, 84: Line control section, 9: Board work line, 91: Component mounter

The invention claimed is:

1. A warehouse system comprising:
   a component container warehouse configured to store multiple component containers that accommodate multiple components;
   a component supply unit warehouse configured to store multiple component supply units used when supplying the components accommodated in the component container to a component mounter;
   a component container loader configured to load the component container into the component supply unit to form a prepared component supply unit, and configured to separate the component container from the prepared component supply unit;
   a conveyance robot configured to move between the component container warehouse, the component supply unit warehouse, and the component container loader to convey the component container and the component supply unit to the component container loader; and
   a warehouse control section configured to receive a loading work instruction and a separation work instruction,
   wherein when the loading work instruction is received, the warehouse control section is configured to
   control the conveyance robot to convey the component container and the component supply unit to the component container loader,
   control component container loader to load the component container into the component supply unit at a predetermined position to form the prepared component supply unit, and control the conveyance robot to convey the prepared component supply unit to a predetermined location, and wherein when the separation work instruction is received, the warehouse control section is configured to control the conveyance robot to convey the prepared component supply unit from the predetermined location to the component container loader, control the component container loader to separate the component container from the prepared component supply unit, and control the conveyance robot to convey the component container to the component container warehouse, and to convey the component supply unit to the component supply unit warehouse.

2. The warehouse system according to claim 1, wherein the conveyance robot performs a delivery of at least one of the component container and the component supply unit in the component container warehouse, the component supply unit warehouse, and the component container loader.

3. The warehouse system according to claim 1, wherein the component container loader is a reel loader that loads a tape reel, which is the component container, into a feeder device, which is the component supply unit, or a reel cassette which constitutes the feeder device.

4. The warehouse system according to claim 1, wherein the component container loader is a tray loader that loads a tray, which is the component container, into a tray loading unit, which is the component supply unit.

5. The warehouse system according to claim 1, wherein each of the component container warehouse, the component supply unit warehouse, and the component container loader is divided and arranged in multiple stages in a height direction.

6. The warehouse system according to claim 1, wherein the conveyance robot is supplied with power from a non-contact power supply section.

7. The warehouse system according to claim 1, wherein the component container warehouse, the component supply unit warehouse, and the component container loader have a common element in common to each other to enable change in increase and decrease and change in arrangement of the component container warehouse, the component supply unit warehouse, and the component container loader.

8. The warehouse system according to claim 7, wherein the common element includes at least one of:
1) Commonization of at least one of an external shape and an installation structure,
2) Commonization of at least one of a power supply specification and a power supply section,
3) Commonization of at least one of a communication specification and a communication section,
4) Commonization of a control section that controls an operation,
5) Commonization of an upper-level control section that issues a command, and
6) Commonization of a carry-in and carry-out process of the component container and the component supply unit.

9. The warehouse system according to claim 1, further comprising at least one of a carry-in section into which at least one of the component container and the component supply unit is carried and a carry-out section from which at least one of the component container and the component supply unit is carried out, within a movement range of the conveyance robot.

10. The warehouse system according to claim 9, wherein at least one of the carry-in section and the carry-out section is a conveyance vehicle stopping section where a conveyance vehicle stops, the conveyance vehicle loading at least one of the component container and the component supply unit and being movable between the warehouse system and the component mounter.

11. The warehouse system according to claim 1, further comprising a work execution section configured to execute work other than loading on at least one of the component container and the component supply unit, within the movement range of the conveyance robot.

12. The warehouse system according to claim 11, wherein the work execution section is a carry-in and information providing section which serves as a carry-in section into which the component container is carried and provides individual identification information to the carried-in component container.

13. A warehouse system comprising:
a component container warehouse configured to store multiple component containers that accommodate multiple components;
a component supply unit warehouse configured to store multiple component supply units used when supplying the components accommodated in the component container to a component mounter;
a component container loader configured to load the component container into the component supply unit to form a prepared component supply unit, and configured to separate the component container from the prepared component supply unit; and
a conveyance robot configured to move between the component container warehouse, the component supply unit warehouse, and the component container loader to convey the component container and the component supply unit to the component container loader,
wherein when the warehouse system performs a loading work,
the conveyance robot conveys the component container and the component supply unit to the component container loader,
the component container loader loads the component container into the component supply unit at a predetermined position to form the prepared component supply unit, and
the conveyance robot conveys the prepared component supply unit to a predetermined location, and
wherein when the warehouse system performs a separation work,
the conveyance robot conveys the prepared component supply unit from the predetermined location to the component container loader,
the component container loader separates the component container from the prepared component supply unit, and
the conveyance robot conveys the component container to the component container warehouse, and conveys the component supply unit to the component supply unit warehouse.

14. A warehouse system comprising:
a component container warehouse configured to store multiple component containers that accommodate multiple components;
a component supply unit warehouse configured to store multiple component supply units used when supplying the components accommodated in the component container to a component mounter;
a component container loader configured to load the component container into the component supply unit to form a prepared component supply unit, and configured to separate the component container from the prepared component supply unit; and
a conveyance robot configured to move between the component container warehouse, the component supply unit warehouse, and the component container loader to convey the component container and the component supply unit to the component container loader.

* * * * *